(12) United States Patent
Chien et al.

(10) Patent No.: US 11,287,746 B1
(45) Date of Patent: Mar. 29, 2022

(54) SYSTEM AND METHOD FOR OVERLAY ERROR REDUCTION

(71) Applicant: Taiwan Semiconductor Manufacturing Co., Ltd., Hsinchu (TW)

(72) Inventors: Hung-Chung Chien, Hsinchu (TW); Hao-Ken Hung, Hsinchu (TW); Chih-Chieh Yang, Hsinchu (TW); Ming-Feng Shieh, Hsinchu (TW); Chun-Ming Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/197,707

(22) Filed: Mar. 10, 2021

Related U.S. Application Data

(60) Provisional application No. 63/085,539, filed on Sep. 30, 2020.

(51) Int. Cl.
  *G03F 7/20* (2006.01)
(52) U.S. Cl.
  CPC ........ *G03F 7/70466* (2013.01); *G03F 7/2022* (2013.01); *G03F 7/702* (2013.01);
  (Continued)
(58) Field of Classification Search
  CPC .. G03F 7/70008; G03F 7/702; G03F 7/70266; G03F 7/70366; G03F 7/70633; G03F 7/70033; G03F 7/70283; G03F 7/70375; G03F 7/70425; G03F 7/7045; G03F 7/70458; G03F 7/70466; G03F 7/70483; G03F 7/70491; G03F 7/7055; G03F 7/70275; G03F 7/70733; G03F 7/7075; G03F 7/70775; G03F 7/70991; G03F 7/2002; G03F 7/2004; G03F 7/2022; G03F 7/2032; G03F 7/70691–70725; G03F 9/7003; G03F 9/7007; G03F 9/7011; G03F 9/7015; G03F 9/7049;
  (Continued)

(56) References Cited

U.S. PATENT DOCUMENTS

| | | | | |
|---|---|---|---|---|
| 5,923,403 | A * | 7/1999 | Jain | G03F 7/70283 355/26 |
| 2003/0224262 | A1 * | 12/2003 | Lof | G03F 9/7084 430/22 |

(Continued)

*Primary Examiner* — Christina A Riddle
(74) *Attorney, Agent, or Firm* — Seed Intellectual Property Law Group LLP

(57) ABSTRACT

Semiconductor processing apparatuses and methods are provided in which a semiconductor wafer is flipped and then rotated between patterning of front and back sides of the semiconductor wafer by first and second reticles, respectively. In some embodiments, a method includes patterning, by a first reticle, a first layer on a first side of a semiconductor wafer while the first side of the semiconductor wafer is facing a first direction. The semiconductor wafer is then flipped. A second side of the semiconductor wafer that is opposite the first side faces the first direction after the flipping the semiconductor wafer. The semiconductor wafer is then rotated about a rotational axis extending along the first direction, and a second layer on the second side of the semiconductor wafer is patterned by a second reticle.

20 Claims, 10 Drawing Sheets

(52) U.S. Cl.
CPC ...... *G03F 7/70008* (2013.01); *G03F 7/70266* (2013.01); *G03F 7/70366* (2013.01); *G03F 7/70633* (2013.01)

(58) Field of Classification Search
CPC ...... G03F 9/7073; G03F 9/7076; G03F 9/708; G03F 9/7084; G03F 9/7088; H01L 21/02016
USPC ........ 355/18, 26, 46, 52–74, 77, 133; 430/5, 430/22, 30; 250/492.1–492.3, 503.1, 250/504 R; 356/399–401
See application file for complete search history.

(56) References Cited

U.S. PATENT DOCUMENTS

| | | | |
|---|---|---|---|
| 2004/0156028 A1* | 8/2004 | Okada | G03F 9/7003 355/53 |
| 2007/0216041 A1* | 9/2007 | Patti | H01L 23/544 257/797 |
| 2009/0226677 A1* | 9/2009 | Pici | G03F 7/70366 428/195.1 |
| 2010/0210088 A1* | 8/2010 | Ishimaru | H01L 27/14687 438/401 |
| 2012/0264276 A1* | 10/2012 | Reed | G03F 7/2022 438/462 |

* cited by examiner

SYSTEM AND METHOD FOR OVERLAY ERROR REDUCTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

Photolithography is a process for transferring a pattern from a reticle to a workpiece using radiation, and is repeatedly performed during the manufacture of an integrated circuit (IC). Further, photolithography comprises overlay control, which is a process for aligning the reticle to the workpiece by minimizing overlay variability between first alignment structures of the workpiece and second alignment structures of the reticle.

As semiconductor processes evolve to provide for smaller critical dimensions, and devices reduce in size and increase in complexity including number of layers, a way of accurately patterning the features with reduced overlay error is in order to improve the quality, reliability, and yield of the devices.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
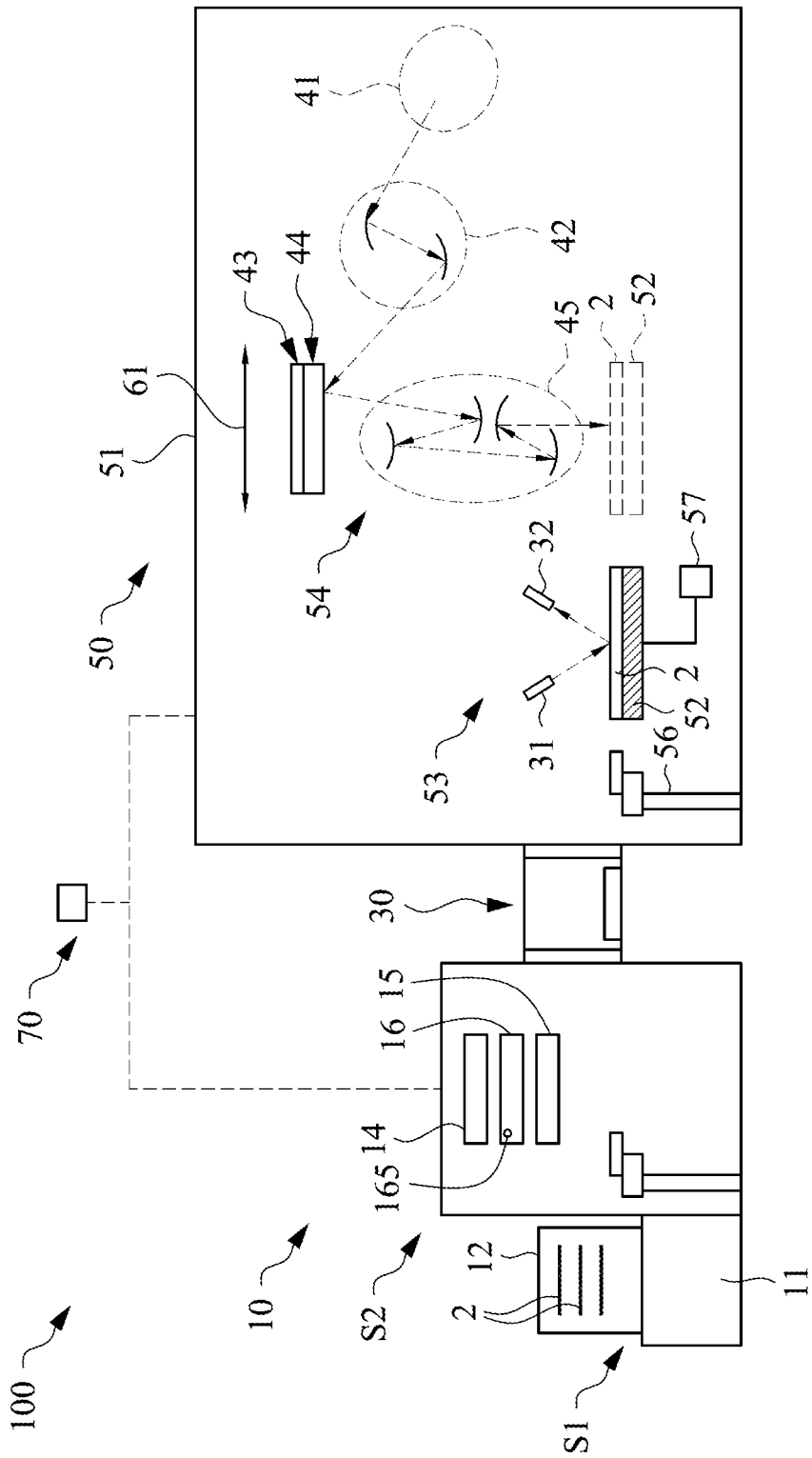
FIG. 1 is a schematic diagram illustrating a lithographic system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein include semiconductor processing apparatuses and methods that facilitate reduction or elimination of overlay errors between a pattern formed on a first side (e.g., front side) of a semiconductor wafer and a pattern formed on a second side (e.g., back side) of the semiconductor wafer. In some embodiments, systems and methods are provided in which overlay errors resulting from the lenses of EUV lithography tools, which generally have a specific lens fingerprint with directionality which may result, for example, in an overlay offset or shift. By reducing the overlay errors between the patterns formed on the front side and on the back side of the semiconductor wafer, patterned features or structures on the front side are better aligned with those on the back side of the semiconductor wafer, which produces semiconductor device structures having improved performance and which reduces mitigation measures which otherwise may be desirable in the case of misalignment between the features or structures on the front and back sides of the semiconductor wafer.

A scanner is a process tool for carrying out photolithography. The scanner repeatedly exposes a photosensitive layer coating a workpiece (e.g., a semiconductor wafer) to a reticle pattern, while the workpiece is stepped or moved according to an exposure field layout, to define exposure fields arranged on the workpiece according to the exposure field layout. For each exposure, the workpiece is stepped or moved to a new exposure location and the reticle pattern is scanned across the new exposure location. To maintain proper alignment between the reticle pattern and the workpiece, overlay corrections may be generated by overlay control and applied to equipment parameters of the scanner.

FIG. 1 is a schematic diagram illustrating a lithographic system 100, in accordance with one or more embodiments of the present disclosure. In some embodiments, the lithographic system 100 includes a track apparatus 10, a load lock chamber 30, an exposure apparatus 50, and a controller 70. Embodiments of the present disclosure are not limited thereto, and in various embodiments, one or more of the features described below can be replaced or eliminated in the lithographic system 100.

In some embodiments, the track apparatus 10 includes a cassette station S1 and a processing station S2, which performs substrate processes such as a photoresist coating process, a developing process, or the like, arranged in order. In some embodiments, the cassette station S1 includes a cassette stage 11 and a cassette 12. The cassette stage 11 is a holding structure that holds a number of wafer cassettes, for example, four or more wafer cassettes. Each cassette 12 contains a plurality of semiconductor wafers 2.

In some embodiments, the processing station S2 is located between the cassette station S1 and the load lock chamber 30. The processing station S2 transfers the semiconductor wafer 2 between the cassette station S1 and the load lock chamber 30.

In some embodiments, the processing station S2 is configured to carry out a photoresist coating process and a developing process, and the processing station S2 includes a transfer mechanism 13, a coating chamber 14, a developing chamber 15 and a thermal chamber 16. The transfer mechanism 13 is a transferring portion that transfers the semiconductor wafer 2 to and from the processing station S2. The transfer mechanism 13 may include one or more movable wafer handling structures which may be, for example, elevated, moved leftward and rightward, moved forward and backward, and rotated around an axis (e.g., the vertical axis) so as to transfer the semiconductor wafer 2 among the coating chamber 14, the developing chamber 15, and the thermal chamber 16.

The thermal chamber 16 is configured to carry out a pre-treatment or post-treatment for the treatment to be performed in the developing chamber 15 or the coating chamber 14. For example, the thermal chamber 16 may include a heating unit configured to heat each wafer 2 after the wafers 2 are subjected to the photoresist coating process. Alternatively or additionally, the thermal chamber 16 may include a post-exposure baking unit configured to heat each wafer 2 after the wafers 2 are subjected to a lithography exposing process. Alternatively or additionally, the thermal chamber 16 may include a post-baking unit configured to perform a heating process to vaporize moisture on each wafer 2 after the developing process.

In some embodiments, the lithographic system 100 may include a metrology tool 165, which may be positioned in the thermal chamber 16. In some embodiments, the metrology tool 165 includes a thermal couple adapted for measuring temperature of the semiconductor wafer 2 in the thermal chamber 16. In some embodiments, the metrology tool 165 is configured to measure one or more topographic parameters, such as the topography or topographic height of the semiconductor wafer 2 positioned in the thermal chamber 16. For example, in some embodiments, the metrology tool 165 discharges gas onto a surface of the semiconductor wafer 2 via a nozzle and detects a variation in the pressure of the gas via an air pressure gauge. Based on the detected variation of the pressure of the gas, the metrology tool 165 may determine the topology (e.g., topographic levels or heights) of the semiconductor wafer 2 or any portion thereof.

The metrology tool 165 may be electrically or communicatively coupled to the controller 70. In some embodiments, the measurements from the metrology tool 165 are transmitted to the controller 70 for determining one or more process parameters for the exposure apparatus 50. For example, in various embodiments, one or more operational process parameters of the exposure apparatus 50 may be varied or otherwise associated with the particular topography of one or more features defined on the semiconductor wafer 2. It should be appreciated that embodiments of the present application may include one or more metrology tools 165, and a number of metrology tools 165 may vary based upon the number of regions to be measured on the semiconductor wafer 2 at one time.

The load lock chamber 30 is located between the track apparatus 10 and the exposure apparatus 50. The load lock chamber 30 is arranged between the track apparatus 10 and the exposure apparatus 50. The load lock chamber 30 is configured to preserve the atmosphere within the exposure apparatus 50 by separating it from the track apparatus 10. The load lock chamber 30 is capable of creating an atmosphere compatible with the exposure apparatus 50 or the track apparatus 10 depending on where the loaded the semiconductor wafer 2 is scheduled to be next. This can be performed by altering the gas content of the load lock chamber 30, for example, by adding gas or creating a vacuum, or by any other suitable means for adjusting the atmosphere in the load lock chamber 30 to match the atmosphere of the exposure apparatus 50 or the track apparatus 10. When the correct atmosphere has been reached, the semiconductor wafer 2 can be accessed by the transfer mechanism 13 or 56.

The exposure apparatus 50 is configured to use radiation or a high-brightness light to expose a photosensitive layer (e.g., a photoresist layer) coated on the semiconductor wafer 2. The exposure apparatus 50 may be generically referred to as a scanner that is operable to perform lithography exposing processes with respective radiation source and exposure mode. In some embodiments, the exposure apparatus 50 includes a vacuum vessel 51, a wafer stage 52, an optical measurement tool 53, an exposure tool 54 and a transfer mechanism 56.

The vacuum vessel 51 preserves a vacuum environment at an ultra-high vacuum pressure. The wafer stage 52, the optical measurement tool 53 and the exposure tool 54 are positioned in the vacuum vessel 51. The wafer stage 52 is configured to support or hold the semiconductor wafer 2 during processing in the exposure apparatus 50, for example, the wafer stage 52 may be physically coupled to the semiconductor wafer 2. In some embodiments, the wafer stage 52 is positioned in the vacuum vessel 51 and moveable between a measuring position (indicated by solid lines) and an exposure position (indicated by dotted lines) by a driving member, such as linear motor (not shown). In some embodiments, the wafer stage 52 is radially or rotationally movable in order to transfer the semiconductor wafer 2, for example, between the measuring position and the exposure position. Moreover, the rotational movement of the wafer stage 52 may facilitate rotating the semiconductor wafer 2 about a rotational axis (e.g., a vertical axis), for example, between one or more lithographic processes or exposures in the exposure position.

The optical measurement tool 53 is configured to measure the topography, e.g., the topographic height, of the semiconductor wafer 2 and to provide a determination on the topology (e.g., topographic height or level) of the semiconductor wafer 2 or any portion thereof. The optical measurement tool 53 is positioned over the wafer stage 52 when the wafer stage 52 is positioned in the measuring position.

In some embodiments, the optical measurement tool 53 includes a transducer 31 and a collector 32. The transducer 31 is configured to emit a measuring signal (such as focused incident beam of radiation) to the surface of the semiconductor wafer 2. The collector 32 is configured to receive the measuring signal reflected from the semiconductor wafer 2. The optical measurement tool 53 may be electrically or communicatively coupled to the controller 70. The measurements (such as topology of the semiconductor wafer 2) from the optical measurement tool 53 are transmitted to the controller 70 for determining one or more process parameters for the exposure apparatus 50.

The exposure tool 54 is configured to apply a radiation beam that includes a pattern in the beam's cross-section onto the surface of the semiconductor wafer 2 so as to print or otherwise transfer the desired patterns over a photosensitive layer coated on the semiconductor wafer 2. The exposure tool 54 may be positioned over the wafer stage 52 when the wafer stage 52 is positioned in the exposure position.

Figure 2:
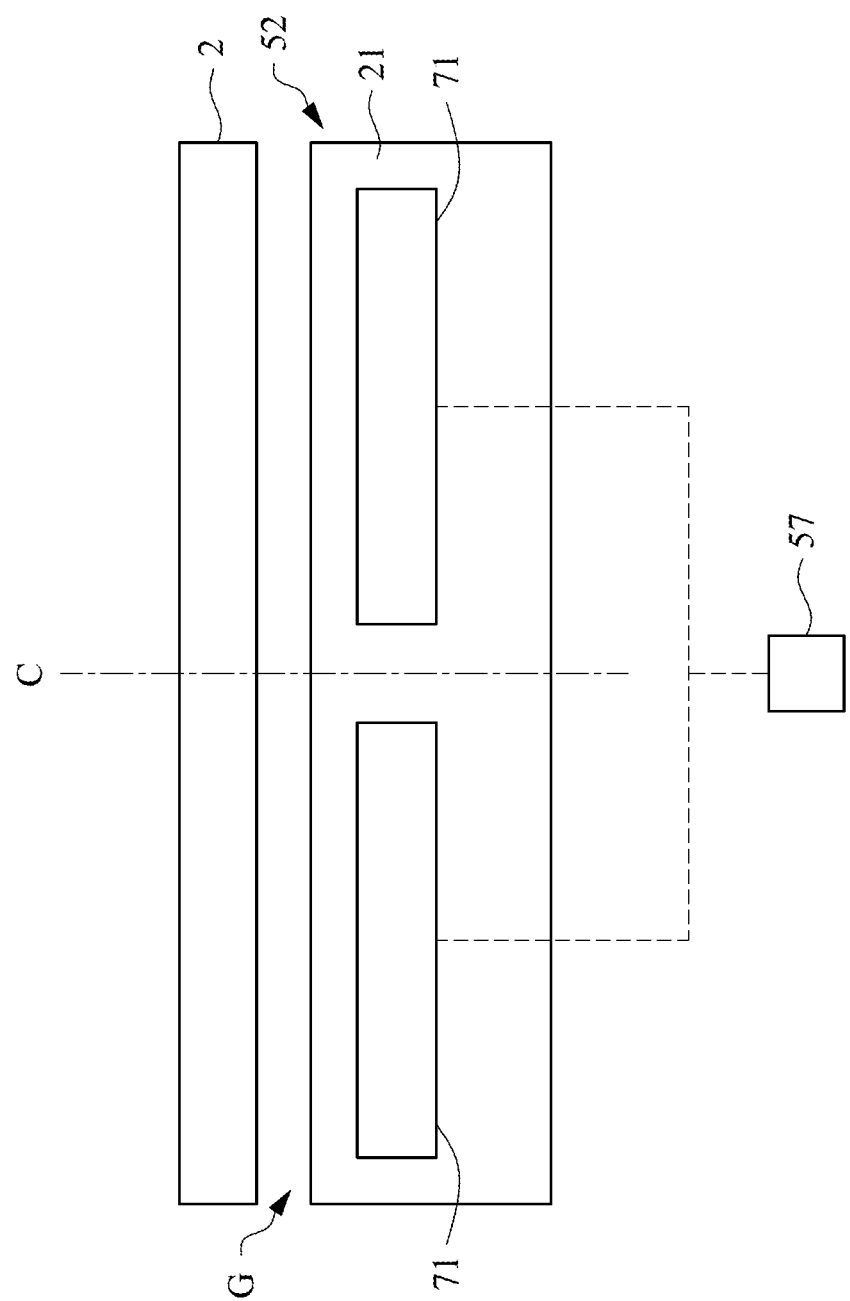
FIG. 2 is a schematic cross-sectional view of a wafer stage with a semiconductor wafer positioned thereon, in accordance with some embodiments.

FIG. 2 is a schematic cross-sectional view of a wafer stage 52 with a semiconductor wafer 2 positioned thereon, in accordance with some embodiments. The wafer stage 52 includes a dielectric body 21, a power supply 57 and a pair of electrodes 71. The electrodes 71 are embedded in the dielectric body 21. The dielectric body 21 may be an insulator, with the electrodes 71 embedded therein.

In various embodiments, the electrodes 71 may be coupled to the power supply 57 in a monopolar or bipolar arrangement. In operation, the power supply 57 applies a voltage to the electrodes 71, and causes electrostatic charges, e.g., negative charges. Electrostatic charges of the opposite polarity, e.g., positive charges, accumulate in the semiconductor wafer 2 on or near the back side by which the semiconductor wafer 2 is supported on the wafer stage 52. A gap, such as G, may exist due to one or more properties on the back side of the wafer supported on a chuck, such as warpage of the wafer or the presence of contaminants, etc.

A clamping force is caused by the electrostatic attraction between the accumulated charges having opposite polarities. The clamping force holds or secures the semiconductor wafer 2 to the wafer stage 52. The clamping force depends on a variety of factors, including the size of the gap G, the thickness of the dielectric body 21 between the electrodes 71 and the top surface of the wafer stage 52, and the voltage applied to the electrodes 71.

The configuration of the wafer stage 52 is not limited to the examples described above, and it will be appreciated that any suitable wafer stage 52 configured to hold a semiconductor wafer during processing in the exposure apparatus 50 and to rotate the wafer, for example, between lithographic exposures may be utilized in various embodiments.

Referring again to FIG. 1, the exposure tool 54 is configured to supply a high-brightness light to expose a photoresist layer coated on the semiconductor wafer 2. In some embodiments, the exposure tool 54 includes a radiation source 41, an illuminator 42, a reticle chuck or reticle stage 43, a mask or reticle 44, and a projection optics assembly 45.

In some embodiments, the radiation source 41 can be an extreme ultraviolet (EUV) source which generates an EUV light with a wavelength centered at about 13.5 nm. However, it should be appreciated that the radiation source 41 is not limited to emitting EUV light, and in various embodiments, the radiation source may be any radiation source suitable for performing a lithographic process, such as an ultraviolet (UV) source or a deep ultraviolet (DUV) source. In some embodiments, the radiation source 41 may include a synchrotron, or a plasma source such as ionized xenon (Xe) or tin (Sn) produced by a laser or thermal excitation, and emits EUV radiation with wavelengths in a range of about 10 nm to about 130 nm.

In some embodiments, the illuminator 42 includes various refractive optic components, such as a single lens or a lens system having multiple lenses (zone plates) or alternatively reflective optics (e.g., for EUV lithography system), such as a single mirror or a mirror system having multiple mirrors in order to direct light from the radiation source 41 onto the reticle stage 43, particularly to a reticle 44 secured to the reticle stage 43. In some embodiments in which the radiation source 41 generates light in the EUV wavelength range, reflective optics may be employed.

The reticle stage 43 is configured to secure the reticle 44. In some embodiments, the reticle stage 43 includes an electrostatic chuck to secure the reticle 44. In some embodiments, the reticle 44 may be a reflective mask and includes a multiple reflective multiple layers (ML) deposited on a substrate so as to highly reflect the EUV light. In some embodiments, the reticle 44 contains a multilayer mirror comprising alternating reflective (e.g., Mo, Ru, etc.) and spacer layers (e.g., Si) configured to reflect incident radiation through Bragg interference, resulting in a peak reflectance wavelength of about 13.5 nm, which allows for a finer feature resolution when patterning the semiconductor wafer 2.

The projection optics assembly 45 is configured for imaging the pattern of the reticle 44 on to the semiconductor wafer 2 secured to the wafer stage 52 of the exposure apparatus 50. In some embodiments, the projection optics assembly 45 includes a set of optical lenses. The optical lenses may include refractive optics (such as for a UV lithography system) or reflective optics (such as for an EUV lithography system) in various embodiments. The radiation directed from the reticle 44, carrying the image of the pattern defined on the reticle, is collected by the projection optics assembly 45. The illuminator 42 and the projection optics assembly 45 may be collectively referred to as an optical module of the exposure apparatus 50.

In some embodiments, the exposure apparatus 50 further includes a number of actuators connected to the illuminator 42 and the projection optics assembly 45 to adjust the position of optic elements of the illuminator 42 and the projection optics assembly 45. The actuators are electrically or communicatively coupled to the controller 70. In addition, the actuator is controlled to drive the movement of the optic elements of the illuminator 42 and the projection optics assembly 45 according the signals issued by the controller 70. As a result, the focal length of the radiation scanned over the semiconductor wafer 2 can be adjusted.

In some embodiments, the controller 70 includes an information handling system such as a computer, server, workstation, or another suitable device and is electrically or communicatively coupled to one or more elements of the lithographic system 100 to perform one or more of the features or functions of the lithographic systems described herein.

For example, in some embodiments, the controller 70 is electrically or communicatively coupled to the metrology tool 165 and the optical measurement tool 53 and receives a signal in relation to the height of the semiconductor wafer 2 from the metrology tool 165 and the optical measurement tool 53. In addition, the controller 70 may be electrically or communicatively coupled to the wafer stage 52 of the exposure apparatus 50 so as to control the movement of the wafer stage 52, or to control the power supplied by the power supply 57.

In some embodiments, scanning of the semiconductor wafer 2 during a lithographic process in the exposure apparatus 50 may be accomplished along a scanning direction 61 or first direction (e.g., a Y-axis direction). For example, in some embodiments, the controller 70 is configured to cause the exposure apparatus 50 to repeatedly expose a photosensitive layer on the semiconductor wafer 2 to a reticle pattern of the reticle 44 while the semiconductor wafer 2 is stepped or moved (e.g., by movement of the wafer stage 52) according to an exposure field layout of the reticle 44, thereby defining a plurality of exposure fields arranged on the semiconductor wafer 2 according to an exposure field layout. For example, the controller 70 may control the wafer stage 52 to step or move between exposure locations according to the exposure field layout. In some embodiments, the wafer stage 52 moves between exposure locations along the scanning direction 61. Further, at each exposure location, the controller 70 may control the radiation source 41, the reticle stage 43, and the wafer stage 52 to transfer the reticle pattern to the exposure location. For example, the controller 70 enables the radiation source 41, and subsequently moves the reticle stage 43 and the wafer stage 52 in opposite directions (e.g., opposite to one another along an axis or scanning direction 61) to gradually scan the reticle pattern over the exposure location, thereby gradually forming an exposure field.

Figure 3B:
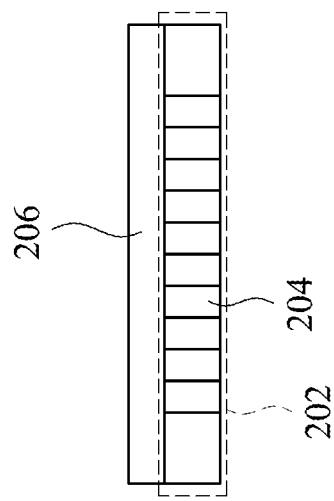
FIG. 3B is a cross-sectional view illustration of the semiconductor wafer shown in FIG. 3A taken along the line A-A'
Figure 3A:
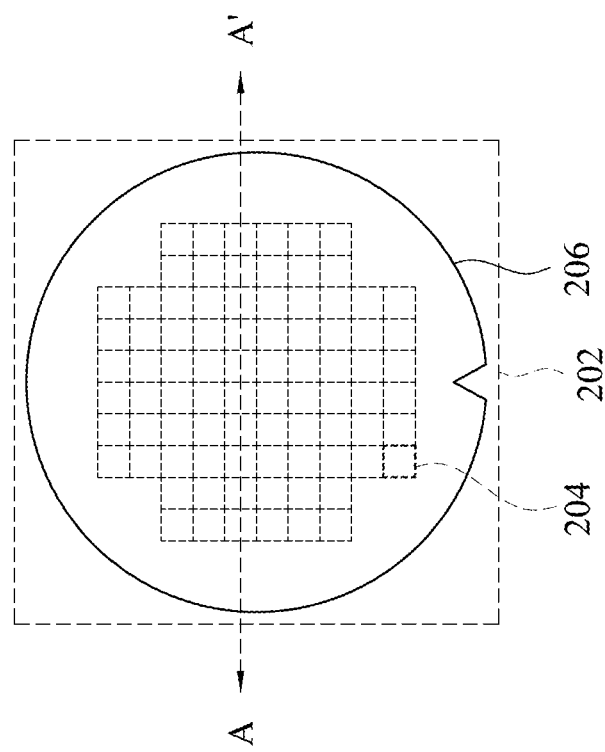
FIG. 3A is a top view illustration of a semiconductor wafer before exposure by an exposure tool, in accordance with some embodiments.

FIG. 3A illustrates a top view of a semiconductor wafer before exposure by an exposure tool, such as the exposure apparatus of the lithographic system of FIG. 1, in accordance with some embodiments. FIG. 3B illustrates a cross-sectional view of the semiconductor wafer shown in FIG. 3A taken along the line A-A'.

The semiconductor wafer 202 may be, for example, representative of the semiconductor wafer 2 of FIG. 1. As illustrated, the semiconductor wafer 202 includes a plurality of integrated circuit (IC) dies 204 which may be at any stage of manufacture. The semiconductor wafer 202 may include a plurality of layers which collectively form the IC dies 204. For example, the semiconductor wafer 202 may include a semiconductor substrate (not shown), a layer of semiconductor devices (not shown) on or in the semiconductor substrate, layers of dielectric or conductive material (not shown) stacked over the semiconductor substrate, or any other layers of semiconductor devices. The semiconductor substrate may be, for example, a bulk wafer of monocrystalline silicon or some other semiconductor, a semiconductor-on-insulator (SOI) wafer, or some other type of wafer. The semiconductor devices may be, for example, transistors, capacitors, image sensors, microelectromechanical systems (MEMS) devices, memory cells, some other type of semiconductor device, or a combination of the foregoing. The layers of dielectric or conductive material may, for example, define a back-end-of-line (BEOL) interconnect structure of metal lines and vias covering the semiconductor devices and the semiconductor substrate.

A photosensitive layer 206 is arranged over and covers the semiconductor wafer 202, and is used to pattern one or more underlying layers (not shown). For example, the layers of dielectric or conductive material may include a first back-end-of-line (BEOL) metallization layer bordering the photosensitive layer 206, such that the photosensitive layer 206 may be used to pattern the first BEOL metallization layer. To facilitate patterning of the one or more underlying layers, the photosensitive layer 206 is a photosensitive material that translates patterned radiation (e.g., light from the radiation source 41) into a physical mask. The photosensitive material may be, for example, photoresist. Once the patterned radiation has been translated into the physical mask on the semiconductor wafer 202, the physical mask may then be used to pattern the one or more underlying layers. For example, an etch may be performed into the one or more underlying layers with the physical mask in place, thereby transferring a pattern of the physical mask to the one or more underlying layers.

Figures 4A, 4B:
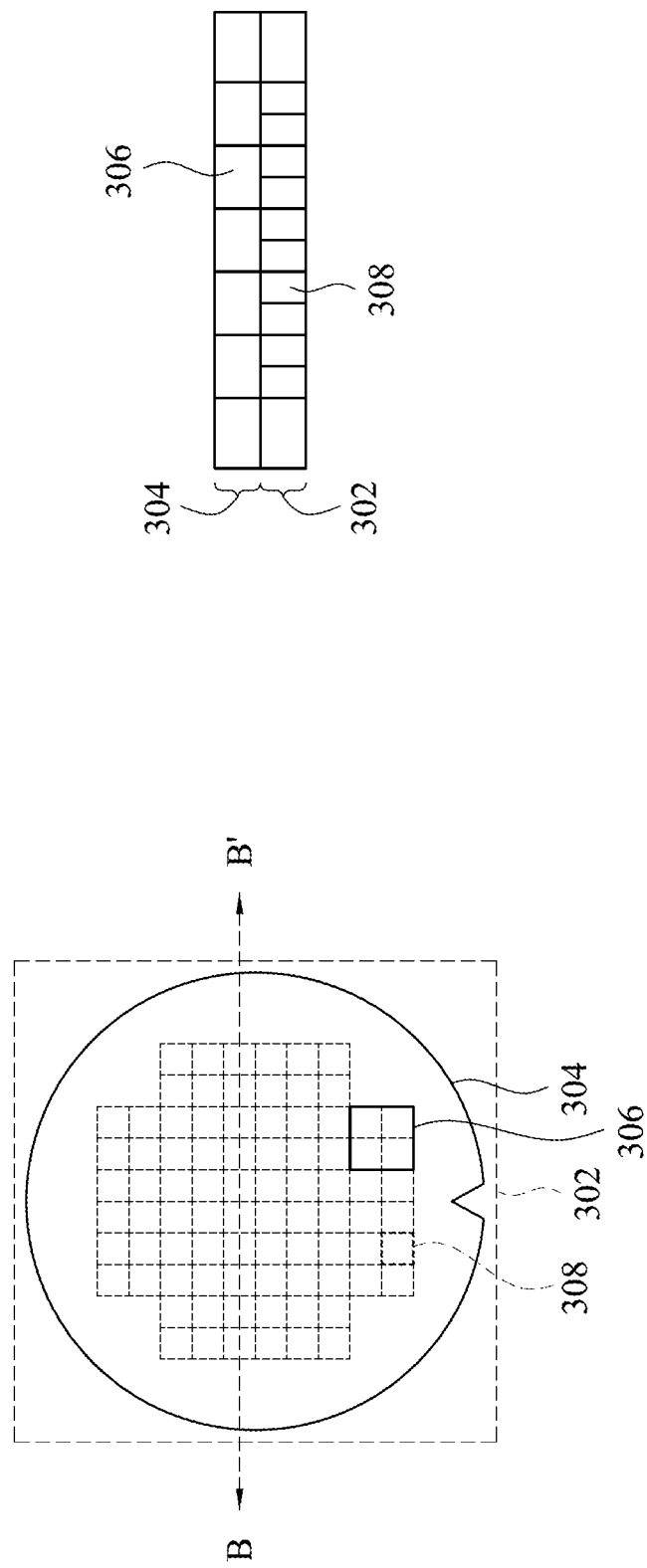
FIG. 4A is a top view illustration of a semiconductor wafer after exposure by an exposure tool, in accordance with some embodiments.
FIG. 4B is a cross-sectional view illustration of the semiconductor wafer shown in FIG. 4A taken along the line B-B'.

FIG. 4A illustrates a top view of a semiconductor wafer after exposure by an exposure tool, such as the exposure apparatus of the lithographic system of FIG. 1, in accordance with some embodiments. FIG. 4B illustrates a cross-sectional view of the semiconductor wafer shown in FIG. 4A taken along the line B-B'.

The semiconductor wafer 302 may be, for example, representative of the semiconductor wafer 2 of FIG. 1.

As illustrated, a photosensitive layer 304 covers the semiconductor wafer 302 and includes a plurality of exposure fields 306. The exposure fields 306 are arranged according to an exposure field layout of a reticle (e.g., the reticle 44) used to form the exposure fields 306, and each have a reticle pattern of the reticle. The reticle pattern is not shown in the exposure fields 306 for ease of illustration. In some embodiments, each exposure field 306 covers one or more IC dies 308. For example, each exposure field 306 may cover four IC dies. In other embodiments, each exposure field 306 covers a single IC die, or has the same size or shape as the single IC die.

In various embodiments of the present disclosure, the semiconductor wafer 2 is patterned on both of opposite sides of the semiconductor wafer 2 utilizing the exposure apparatus, such as the exposure apparatus 50. For example, the semiconductor wafer 2 may be patterned on a front side to form first features, and the semiconductor wafer 2 may then be flipped (e.g., by turning the semiconductor wafer 2 over on the wafer stage 52) and the back side of the semiconductor wafer 2 may then patterned to form second features.

Figure 5B:
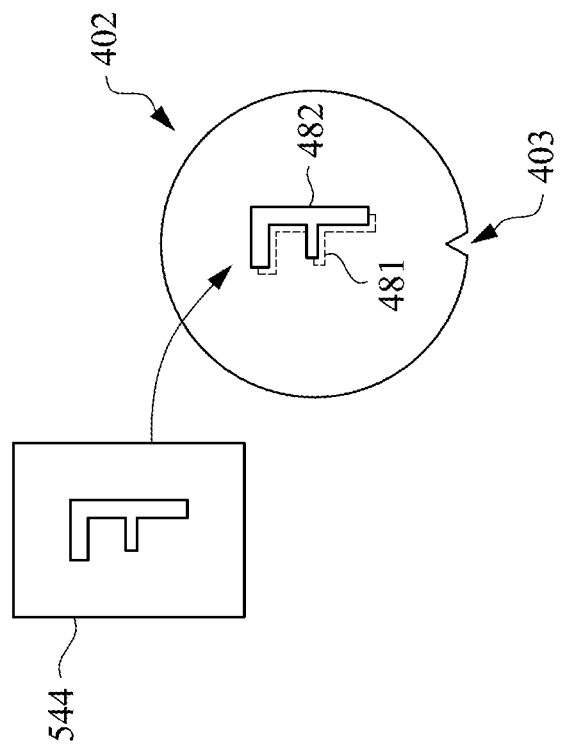
FIG. 5B schematically illustrates an example of patterning of a back side of the semiconductor wafer, in accordance with some embodiments.
Figure 5A:
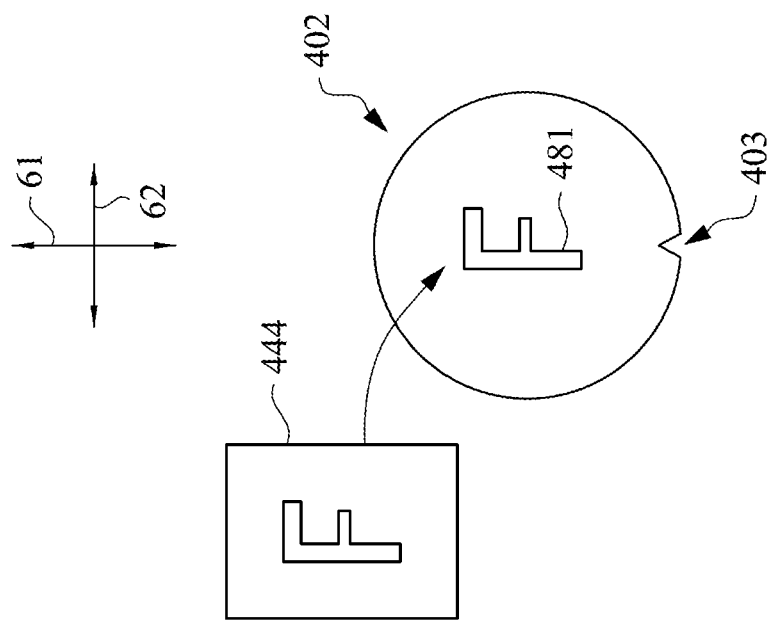
FIG. 5A schematically illustrates an example of patterning of a front side of a semiconductor wafer, in accordance with some embodiments.

FIG. 5A schematically illustrates an example of patterning of a front side of a semiconductor wafer 402, which may be performed, for example, in the lithographic system 100 of FIG. 1. As shown in FIG. 5A, a front side reticle 444 is utilized to form a pattern 481 on a photosensitive layer on the front side of the semiconductor wafer 402. The front side reticle 444 may carry any pattern to be formed or transferred onto the front side of the semiconductor wafer 402. In FIG. 5A, the front side reticle 444 is shown as transferring a pattern 481 in the shape of the letter "F"; however, this pattern is merely provided for ease of illustration, and it will be readily appreciated that the front side reticle 444 may transfer any pattern having any shape onto the semiconductor wafer 402 in order to form any features of semiconductor devices, including for example, features of transistors, capacitors, image sensors, microelectromechanical systems (MEMS) devices, memory cells, interconnect structures of metal lines or vias, or any other structures or features of semiconductor devices.

The pattern 481 of the front side reticle 444 may be transferred to the semiconductor wafer 402 by any of the techniques described herein, including, for example, by scanning of the exposure apparatus 50 having the radiation source 41, illuminator 42, reticle stage 43, projection optics assembly 45, and the reticle 444. For example, radiation emitted by the radiation source 41 may be directed through the illuminator 42 and received at the reticle 444, which reflects the incident radiation through the projection optics assembly 45 and onto the photosensitive layer on the semiconductor wafer 402, thereby transferring the reticle pattern (e.g., "F") onto the front side of the semiconductor wafer 402 as the exposure tool 54 scans the surface of the semiconductor wafer 402 while the semiconductor wafer 402 is moved or stepped along the scanning direction 61. In some embodiments, the exposure apparatus 50 scans the semiconductor wafer 402 by movement of one or more of the optical module (e.g., the illuminator 42 and the projection optics assembly 45), the reticle stage 43, or the wafer stage 52 along the scanning direction 61.

In some embodiments, the exposure apparatus 50 may scan a first region or line of the semiconductor wafer 402 along the scanning direction 61, with the first region having a particular or defined width along a second direction 62 transverse or orthogonal to the scanning direction. For example, the first region of the semiconductor wafer 402 may be a columnar region extending across the front side of the semiconductor wafer 402 which may be scanned along the scanning direction 61. The optical module, the reticle stage 43, or the wafer stage 52 may then be moved in the second direction 62, at which point a second region having the particular or defined width along the second direction 62 may be scanned along the scanning direction 61. In this manner, the complete front side surface of the semiconductor wafer 402 may be scanned, and the pattern 481 may be transferred from the reticle 444 to the front side of the semiconductor wafer 402.

FIG. 5B schematically illustrates an example of patterning of a back side of the semiconductor wafer 402, which may be performed, for example, in the lithographic system 100 of FIG. 1. Prior to patterning the back side of the semiconductor wafer 402, in some embodiments, the semiconductor wafer 402 is flipped so that the front side of the semiconductor wafer 402 faces the wafer stage 52, while the back side of the semiconductor wafer 402 faces the projection optics assembly 45 and therefore is positioned to be patterned by the exposure apparatus 50. The semiconductor wafer 402 may be aligned based on an alignment indicator 403, in order to ensure that an orientation of the wafer 402 during front side patterning corresponds with or matches an orientation of the wafer 402 during back side patterning. For example, during front side patterning, the alignment indicator 403 may be oriented at a lowest position along the scanning direction 61 (e.g., at the 6 o-clock position as shown in FIG. 5A). After front side patterning is completed, the wafer may be flipped about the y-axis or the axis of the scanning direction 61, such that the back side of the wafer faces up and the alignment indicator 403 remains at the lowest position along the scanning direction (e.g., at the 6 o-clock position as shown in FIG. 5B). In this manner, the features that are formed during patterning of the back side of the semiconductor wafer 402 are aligned with or otherwise correspond to the features that are formed during patterning of the front side of the semiconductor wafer 402.

As shown in FIG. 5B, a back side reticle 544 is utilized to form a pattern 482 on a photosensitive layer on the back side of the semiconductor wafer 402. The back side reticle 544 may carry any pattern to be formed or transferred onto the back side of the semiconductor wafer 402. In some embodiments, the back side reticle 544 has a pattern that is a mirror-image of the pattern of the front side reticle 444, with the pattern of the back side reticle 544 being mirrored about an axis (e.g., the Y-axis or the scanning direction 61) with respect to the pattern of the front side reticle 444. For example, the back side reticle 544 may transfer a pattern having the shape of a backward letter "F" (e.g., mirrored about the Y-axis). However, this pattern is merely provided for ease of illustration, and it will be readily appreciated that the back side reticle 544 may transfer any pattern having any shape onto the semiconductor wafer 402 in order to form any features of semiconductor devices, including for example, features of transistors, capacitors, image sensors, microelectromechanical systems (MEMS) devices, memory cells, interconnect structures of metal lines or vias, or any other structures or features of semiconductor devices.

The pattern 482 of the back side reticle 544 may be transferred to the semiconductor wafer 402 by any of the techniques described herein. For example, radiation emitted by the radiation source 41 may be directed through the illuminator 42 and received at the back side reticle 544, which reflects the incident radiation through the projection optics assembly 45 and onto the photosensitive layer on the semiconductor wafer 402, thereby transferring the reticle pattern (e.g., backwards "F") onto the back side of the semiconductor wafer 402 as the exposure tool 54 scans the surface of the semiconductor wafer 402 while the semiconductor wafer 402 is moved or stepped along the scanning direction 61.

As can be seen in dashed lines in FIG. 5B, the pattern 481 on the front side of the semiconductor wafer 402 may be somewhat misaligned with the pattern 582 on the back side of the semiconductor wafer 402. This may be the result of overlay error resulting from the front side and back side patterning of the semiconductor wafer 402. The overlay error may result from asymmetric reticle magnification through the optical components of the lithographic system 100, such as through one or more lenses of the optical module (e.g., lenses of the illuminator 42 and the projection optics assembly 45). In particular, the optical module of the lithographic system has a specific lens fingerprint with directionality, which can cause the overlay error during back side to front side patterning. Specifically, the lenses of EUV lithography tools (e.g., of the lithographic system 100) generally have a specific lens fingerprint with directionality which may result, for example, in an overlay offset or shift (e.g., a shift in the pattern formed on the semiconductor wafer 402) that varies in amount depending on the position along the X-axis (e.g., the second direction 62). This is illustrated in further detail in FIGS. 6A through 6D.

Figure 6C:
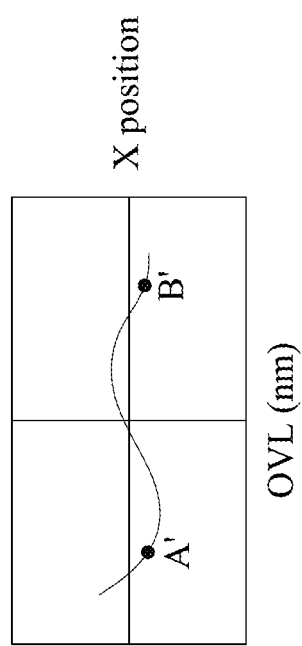
FIG. 6C is a plot illustrating an example of the lens fingerprint during front side patterning of the semiconductor wafer.
Figure 6D:
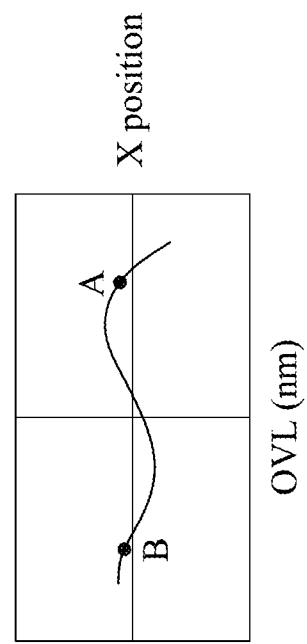
FIG. 6D is a plot illustrating a superposition of the lens fingerprints shown in FIGS. 6B and 6C.
Figure 6A:
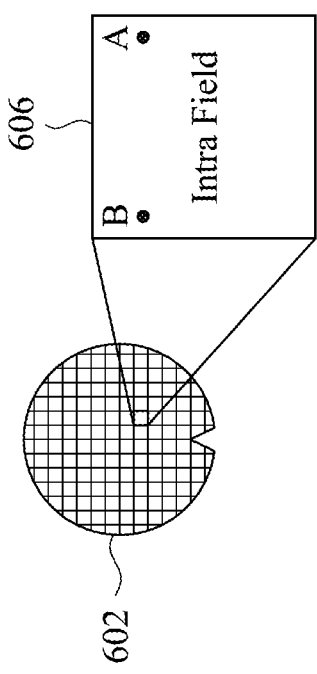
FIG. 6A schematically illustrates an intra-field region of a pattern that is formed on the back side of a semiconductor wafer, in accordance with some embodiments.

FIG. 6A schematically illustrates an intra-field region 606 of a pattern that is formed on the back side of a semiconductor wafer 602. Within the intra-field region 606, a first position A of the pattern and a second position B of the pattern are illustrated.

Figure 6B:
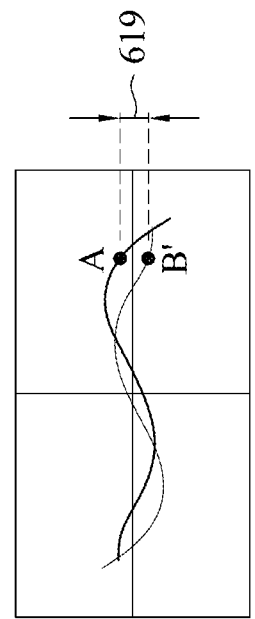
FIG. 6B is a plot illustrating an example of the directionality of the lens fingerprint resulting in an overlay shift during back side patterning of the semiconductor wafer.

FIG. 6B is a plot illustrating the directionality of the lens fingerprint resulting in an overlay shift along the X-axis direction (e.g., the second direction 62) during back side patterning of the semiconductor wafer 602. As shown in FIG. 6B, the overlay shift has an amount (e.g., a magnitude of distance) that varies in amount depending on the position of the pattern within the intra-field region 606 along the X-axis. In particular, the overlay shift generally has a negative value (e.g., a negative offset along the X-axis with respect to a target pattern position) for positions of the pattern in the −X-axis direction, and a positive value for positions of the pattern in the +X-axis direction. The lens fingerprint at the positions A and B of the intra field region 606 during back side patterning are shown in FIG. 6B.

FIG. 6C is a plot illustrating the lens fingerprint during front side patterning of the semiconductor wafer 602. As shown in FIG. 6C, the overlay shift has an amount (e.g., a magnitude of distance) that varies in amount depending on the position of the pattern within the intra-field region 606 along the X-axis. However, since the wafer is flipped and the reticle provides a mirrored image pattern (e.g., as described herein with respect to FIGS. 5A and 5B) on the opposite side of the semiconductor wafer 602, the lens fingerprint at the position A is now shown at A' and the lens fingerprint at position B is now shown as B' in FIG. 6C. The overlay offset or shift due to the lens fingerprint on the front side is therefore backward with respect to the overlay offset or shift due to the lens fingerprint at the back side.

FIG. 6D is a plot illustrating a superposition of the lens fingerprints shown in FIGS. 6B and 6C. As shown in FIG. 6D, the lens fingerprints are misaligned between the back side pattern and the front side pattern of the semiconductor wafer 602, e.g., at the positions of A and B'. The positions A and B' should be ideally aligned with one another when the wafer is flipped, and thus the patterns formed at positions A and B' should be the same, i.e., if there is no overlay error. However, as shown in FIG. 6D, due to overlay error resulting from the lens fingerprints, the overlay shift has a positive value at position A on the back side of the semiconductor wafer 602 (e.g., a positive offset along the X-axis with respect to a target pattern position), while the overlay shift has a negative value at position B' on the front side of the semiconductor wafer 602 (e.g., a negative offset along the X-axis with respect to a target pattern position). The difference between the overlay shift at positions A and B' is the overlay error 619 resulting from the fingerprint error (i.e., the error due to the pattern projections through the lenses of the lithographic system 100 between mirror images of the reticle pattern).

The overlay error 619 is an intra field overlay error, which is developed in each of a plurality of intra field regions 606 during scanning and patterning of the front side and back side of the semiconductor wafer 602. The intra field overlay error 619 is indicated as error along the X-axis direction (e.g., along the second direction 62). It is noted that overlay error in the Y-axis direction may also result from the mirrored back side and front side patterning; however, because the scanner moves in the Y-axis direction (e.g., the scanning direction 61) during scanning, this type of error can be compensated by control of the scanner.

Figure 7B:
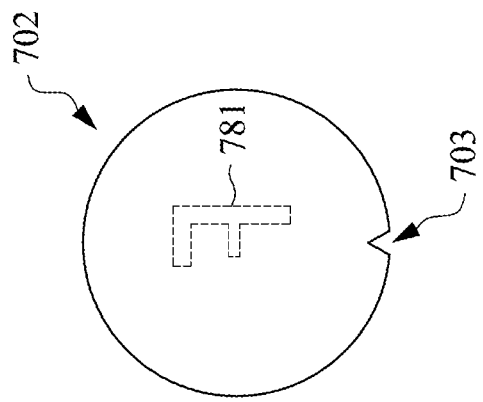
FIG. 7B illustrates a back side of the semiconductor wafer of FIG. 7A, in accordance with some embodiments.
Figure 7A:
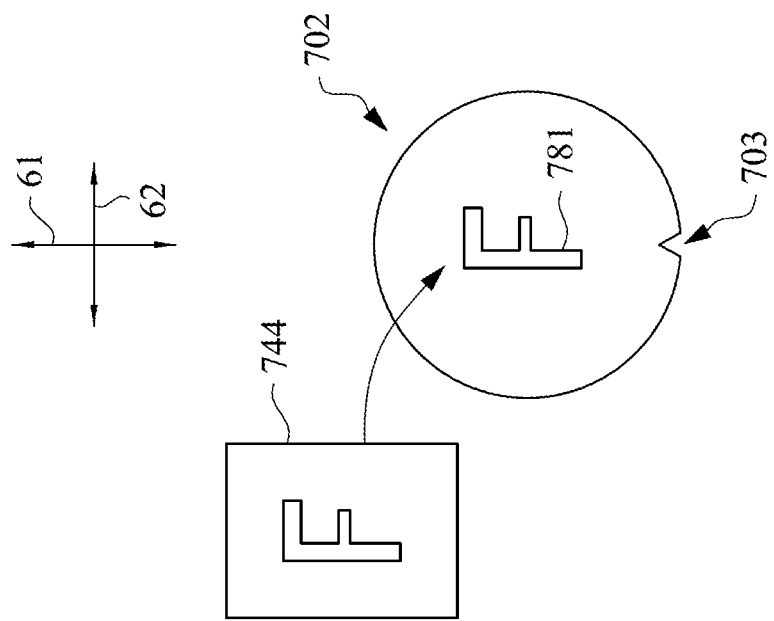
FIG. 7A schematically illustrates patterning of a front side of a semiconductor wafer, in accordance with some embodiments.
Figure 7D:
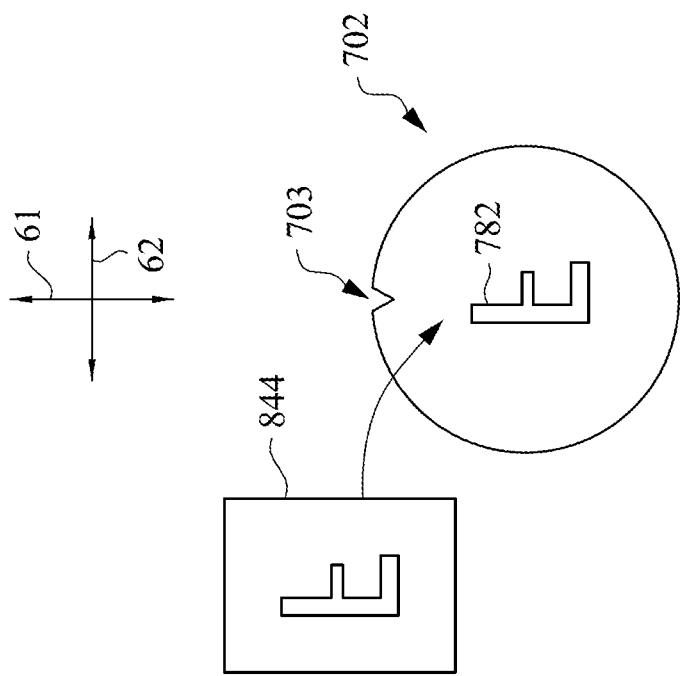
FIG. 7D schematically illustrates an example of patterning of the back side of the semiconductor wafer of FIG. 7C, in accordance with some embodiments.
Figure 7C:
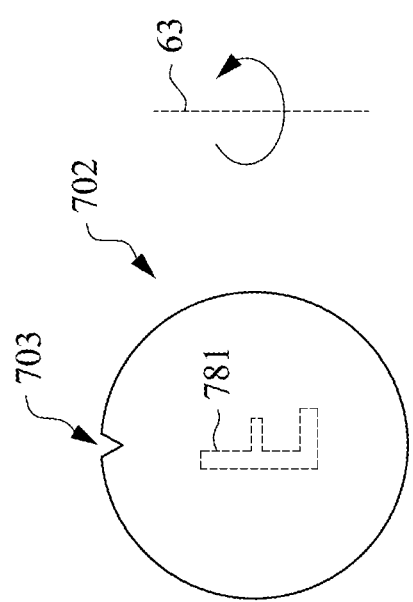
FIG. 7C schematically illustrates a 180° rotation of the semiconductor wafer of FIG. 7B, in accordance with some embodiments.

FIGS. 7A through 7C illustrate a semiconductor processing method in which front side and back side patterning is performed on a semiconductor wafer. The method illustrated in FIGS. 7A through 7C reduces or eliminates the intra field overlay error along the X-axis direction.

FIG. 7A schematically illustrates patterning of a front side of a semiconductor wafer 702 in accordance with some embodiments, which may be performed, for example, in the lithographic system 100 of FIG. 1. As shown in FIG. 7A, a front side reticle 744 is utilized to form a pattern 781 on a photosensitive layer on the front side of the semiconductor wafer 702. The front side reticle 744 may carry any pattern to be formed or transferred onto the front side of the semiconductor wafer 702. In FIG. 7A, the front side reticle 744 is shown as transferring a pattern 781 in the shape of the letter "F"; however, this pattern is merely provided for ease of illustration, and it will be readily appreciated that the front side reticle 744 may transfer any pattern having any shape onto the semiconductor wafer 702 in order to form any features of semiconductor devices, including for example, features of transistors, capacitors, image sensors, microelectromechanical systems (MEMS) devices, memory cells, interconnect structures of metal lines or vias, or any other structures or features of semiconductor devices.

The pattern 781 of the front side reticle 744 may be transferred to the semiconductor wafer 702 by any of the techniques described herein, including, for example, by scanning of the exposure apparatus 50 having the radiation source 41, illuminator 42, reticle stage 43, projection optics assembly 45, and the reticle 744. For example, radiation emitted by the radiation source 41 may be directed through the illuminator 42 and received at the reticle 744, which reflects the incident radiation through the projection optics assembly 45 and onto the photosensitive layer on the semiconductor wafer 702, thereby transferring the reticle pattern (e.g., "F") onto the front side of the semiconductor wafer 702 as the exposure tool 54 scans the surface of the semiconductor wafer 702 while the semiconductor wafer 702 is moved or stepped along the scanning direction 61. In some embodiments, the exposure apparatus 50 scans the semiconductor wafer 702 by movement of one or more of the optical module (e.g., the illuminator 42 and the projection optics assembly 45), the reticle stage 43, or the wafer stage 52 along the scanning direction 61.

FIG. 7B illustrates a back side of the semiconductor wafer 702. As shown in FIG. 7B, the semiconductor wafer 702 is flipped so that the front side of the semiconductor wafer 702 faces the wafer stage 52, while the back side of the semiconductor wafer 702 faces upward, e.g., faces the projection optics assembly 45 and therefore. The semiconductor wafer 702 may be aligned based on an alignment indicator 703, in order to ensure that an orientation of the wafer 702, after flipping the wafer 702, corresponds with or matches the orientation of the wafer 702 during front side patterning (as shown, for example, in FIG. 7A). For example, during front side patterning, the alignment indicator 703 may be oriented at a lowest position along the scanning direction 61 (e.g., at the 6 o-clock position as shown in FIG. 7A). After front side patterning is completed, the wafer may be flipped about the y-axis or the axis of the scanning direction 61, such that the back side of the wafer faces up and the alignment indicator 703 remains at the lowest position along the scanning direction (e.g., at the 6 o-clock position as shown in FIG.

7B). That is, the alignment indicator 703 is at a same position before and after the semiconductor wafer 702 is flipped.

FIG. 7C schematically illustrates a 180° rotation of the semiconductor wafer 702. More particularly, the semiconductor wafer 702 is rotated 180° about a rotational axis 63 that is orthogonal to the scanning direction 61 and to the second direction 62. For example, the axis 63 may be a Z-axis. As shown in FIG. 7C, after the semiconductor wafer 703 is rotated 180°, the alignment indicator 703 is located at the highest position along the scanning direction (e.g., at the 12 o-clock position as shown in FIG. 7C).

FIG. 7D schematically illustrates an example of patterning of the back side of the semiconductor wafer 702 when it is positioned as described above with respect to FIG. 7C. The patterning of the back side of the semiconductor wafer 702 may be performed, for example, in the lithographic system 100 of FIG. 1.

As shown in FIG. 7D, a back side reticle 844 is utilized to form a pattern 782 on a photosensitive layer on the back side of the semiconductor wafer 702. The back side reticle 844 may carry any pattern to be formed or transferred onto the back side of the semiconductor wafer 702. In some embodiments, the back side reticle 844 has a pattern that is a mirror-image of the pattern of the front side reticle 744, with the pattern of the back side reticle 844 being mirrored about an axis (e.g., mirrored about the X-axis or the second direction 62) with respect to the pattern of the front side reticle 744. For example, the back side reticle 844 may transfer a pattern having the shape of an upside-down letter "F" (e.g., mirrored about the X-axis). However, this pattern is merely provided for ease of illustration, and it will be readily appreciated that the back side reticle 844 may transfer any pattern having any shape onto the semiconductor wafer 702 in order to form any features of semiconductor devices, including for example, features of transistors, capacitors, image sensors, microelectromechanical systems (MEMS) devices, memory cells, interconnect structures of metal lines or vias, or any other structures or features of semiconductor devices.

The pattern 782 of the back side reticle 844 may be transferred to the semiconductor wafer 702 by any of the techniques described herein. For example, radiation emitted by the radiation source 41 may be directed through the illuminator 42 and received at the back side reticle 844, which reflects the incident radiation through the projection optics assembly 45 and onto the photosensitive layer on the semiconductor wafer 702, thereby transferring the reticle pattern (e.g., upside-down "F") onto the back side of the semiconductor wafer 702 as the exposure tool 54 scans the surface of the semiconductor wafer 702 while the semiconductor wafer 402 is moved or stepped along the scanning direction 61.

In this manner, the features that are formed during patterning of the back side of the semiconductor wafer 702 are aligned with or otherwise correspond to the features that are formed during patterning of the front side of the semiconductor wafer 702.

As can be seen from FIG. 7D, the pattern 782 is formed on the back side of the semiconductor wafer 702 in substantially identical correspondence with the pattern 781 formed on the front side of the semiconductor wafer 702. That is, the overlay error is substantially reduced or eliminated as compared to the overlay error that is exhibited between the front side and back side patterning of the semiconductor wafer 402 shown in FIG. 5B.

More particularly, the overlay error is reduced or eliminated because the back side reticle 844 is a mirror image of the front side reticle 744 along the X-axis. As previously discussed herein, the lenses of the lithographic system 100 may generally have a specific lens fingerprint with directionality which may result, for example, in an overlay offset or shift (e.g., a shift in the pattern formed on the semiconductor wafer) that varies in amount depending on the position along the X-axis (e.g., the second direction 62).

As described above with respect to FIGS. 5A through 6D, when the pattern of the back side reticle 544 is mirrored about an axis (e.g., the Y-axis or the scanning direction 61) with respect to the pattern of the front side reticle 444, overlay errors between corresponding positions at the front side and the back side of the semiconductor wafer result due to the overlay shift along the X-axis caused by the directionality of the lens fingerprints.

Figure 8C:
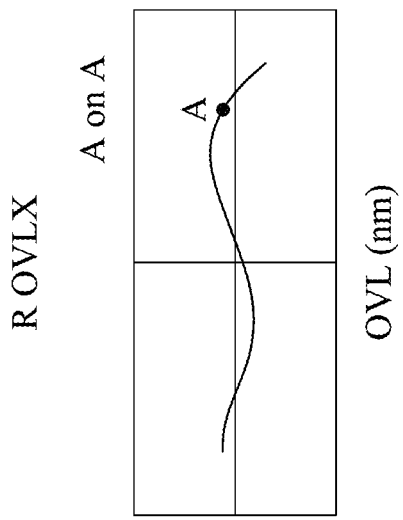
FIG. 8C is a plot illustrating a superposition of the lens fingerprints shown in FIGS. 8A and 8B.

However, in the method described with respect to FIGS. 7A through 7D, the back side reticle 844 is mirrored about the X-axis with respect to the front side reticle 744, such that the directionality of the lens fingerprint is the same for both the front side reticle 744 and the back side reticle 844, and the pattern 782 formed on the back side of the semiconductor wafer 702 corresponds substantially identically with the pattern 781 formed on the front side of the semiconductor wafer 702. This is illustrated in FIGS. 8A through 8C.

Figure 8A:
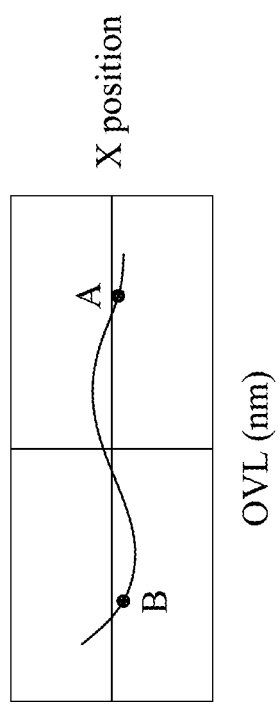
FIG. 8A is a plot illustrating the directionality of the lens fingerprint during back side patterning of a semiconductor wafer, in accordance with some embodiments.
Figure 8B:
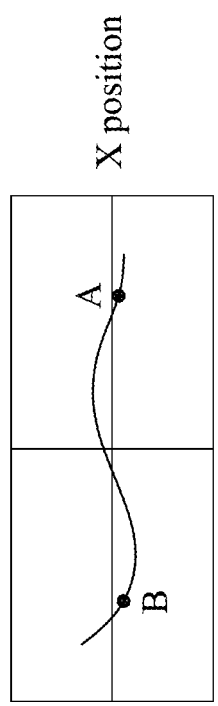
FIG. 8B is a plot illustrating the directionality of the lens fingerprint during front side patterning of the semiconductor wafer of FIG. 8A, in accordance with some embodiments.

In particular, FIG. 8A is a plot illustrating the directionality of the lens fingerprint during back side patterning of the semiconductor wafer 702, and FIG. 8B is a plot illustrating the directionality of the lens fingerprint during front side patterning of the semiconductor wafer 702. FIG. 8C is a plot illustrating a superposition of the lens fingerprints shown in FIGS. 8A and 8B. As can be seen from FIGS. 8A through 8C, the lens fingerprint is the same for both the front side and back side patterning, since the front side reticle and the back side reticle are mirror images of one another along the X-axis. As a result, and as shown in FIG. 8C, there is no overlay error as the value of any overlay shift is identical at positions of A and B on both the front side and the back side of the semiconductor wafer 702. Thus, the method of FIGS. 7A through 7D results in significantly improved intra-field overlay performance along the X-direction (i.e., the overlay error between the front side and back side along the X-axis direction is reduced or eliminated).

Figure 9:
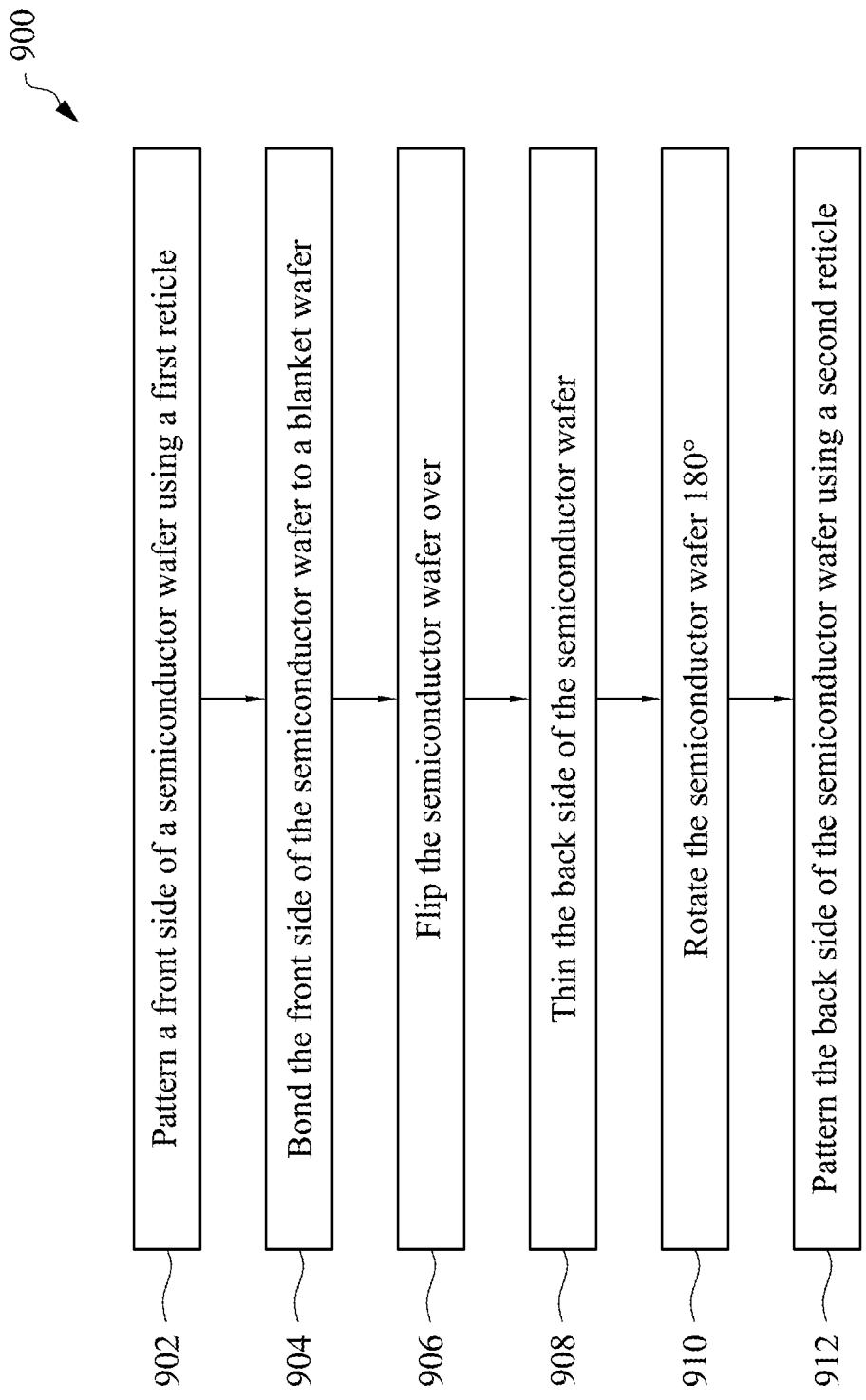
FIG. 9 is a flowchart illustrating a semiconductor processing method, in accordance with some embodiments.

FIG. 9 is a flowchart 900 illustrating a semiconductor processing method, in accordance with one or more embodiments. The method may be implemented, for example, by the lithographic system 100 described herein.

At 902, the method includes patterning a front side of a semiconductor wafer using a first reticle. In some embodiments, the patterning of the front side may include patterning of one or more layers on the front side of the semiconductor wafer. For example, the patterning may include patterning a photosensitive material layer on the front side of the semiconductor wafer by radiation that is reflected onto a photosensitive material layer on by the first reticle, as previously described herein.

In some embodiments, as described for example with respect to FIG. 3A, a photosensitive layer is arranged over and covers a front side of the semiconductor wafer, and is used to pattern one or more underlying layers. To facilitate patterning of the one or more underlying layers, the photosensitive layer may be a photosensitive material that translates patterned radiation into a physical mask. The photosensitive material may be, for example, photoresist. Once the patterned radiation has been translated into the physical mask on the front side of the semiconductor wafer, the physical mask may then be used to pattern the one or more underlying layers. For example, an etch may be performed into the one or more underlying layers with the physical mask in place, thereby transferring a pattern of the physical mask to the one or more underlying layers. In some embodiments, the patterned underlying layers may include one or more of an oxide diffusion layer which defines one or more active areas of semiconductor devices on the front side of the semiconductor wafer, such as source regions, drain regions, channel regions, or the like. In some embodiments, the patterned underlying layers may include a polysilicon layer, a metallization layer, or any other layer of a semiconductor device. In some embodiments, the patterning of the front side may be performed as part of a front-end-of-line fabrication process, which may be implemented to form or otherwise pattern one or more individual devices (e.g., transistors, capacitors, resistors, or the like) in or on the semiconductor wafer.

At 904, the method includes bonding the front side of the semiconductor wafer to a blanket wafer. That is, the front side of the semiconductor wafer is bonded to the blanket wafer after the front side has been patterned, for example, to form one or more structures or devices in or on the front side of the semiconductor wafer. The blanket wafer may be any substrate or wafer, and in some embodiments, the blanket wafer may be a semiconductor wafer. The blanket wafer may be a substantially uniform wafer, in some embodiments, and may be free of any patterned structures or devices. The front side of the semiconductor wafer may be bonded to the blanket wafer by any suitable bonding technique. In some embodiments, the front side of the semiconductor wafer may be bonded to the blanket wafer by oxide bonding, metal bonding, or by any adhesive such as a polymer glue. In some embodiments, the bonding of the front side of the semiconductor wafer to a blanket wafer at 904 may be omitted from the method.

At 906, the method includes flipping the semiconductor wafer over. In some embodiments, the semiconductor wafer is flipped so that the front side of the semiconductor wafer faces the wafer stage, while the back side of the semiconductor wafer faces upward, e.g., in a direction at which the front side was facing during the patterning of the front side of the semiconductor wafer at 902.

At 908, the method includes thinning the back side of the semiconductor wafer. The back side of the semiconductor wafer may be thinned by any suitable technique. In some embodiments, the thinning the back side of the semiconductor wafer at 908 includes thinning the back side of the semiconductor wafer by a chemical-mechanical-polishing (CMP) process. In some embodiments, the thinning the back side of the semiconductor wafer at 908 includes reducing a thickness of the semiconductor wafer to a thickness that is less than 10 µm. In some embodiments, the thinning the back side of the semiconductor wafer at 908 includes reducing a thickness of the semiconductor wafer to a thickness that is less than 1 µm. In some embodiments, the thinning the back side of the semiconductor wafer at 908 includes reducing a thickness of the semiconductor wafer to a thickness that is less than 100 nm. In some embodiments, the thinning the back side of the semiconductor wafer at 908 may be omitted from the method.

At 910, the method includes rotating the semiconductor wafer 180°. In some embodiments, the semiconductor wafer is rotated 180° about a rotational axis 63 that is orthogonal to the scanning direction 61 and to the second direction 62, as described previously herein. The semiconductor wafer may be rotated, for example, by rotation of the wafer stage 52.

At 912, the method includes patterning the back side of the semiconductor wafer using a second reticle. In some embodiments, the patterning of the back side may include patterning of one or more layers on the back side of the semiconductor wafer. For example, the patterning may include patterning a photosensitive material layer on the back side of the semiconductor wafer by radiation that is reflected onto a photosensitive material layer on by the second reticle, as previously described herein.

In some embodiments, as described for example with respect to FIG. 3A, a photosensitive layer is arranged over and covers a front side of the semiconductor wafer, and is used to pattern one or more underlying layers. To facilitate patterning of the one or more underlying layers, the photosensitive layer may be a photosensitive material that translates patterned radiation into a physical mask. The photosensitive material may be, for example, photoresist. Once the patterned radiation has been translated into the physical mask on the back side of the semiconductor wafer, the physical mask may then be used to pattern the one or more underlying layers. For example, an etch may be performed into the one or more underlying layers with the physical mask in place, thereby transferring a pattern of the physical mask to the one or more underlying layers. In some embodiments, the patterned underlying layers may include one or more layers of dielectric or conductive material stacked over the back side of the semiconductor wafer, a metallization layer, or any other layer of a semiconductor device. In some embodiments, the patterning of the back side may be performed as part of a back-end-of-line (BEOL) fabrication process, which may be implemented to form or otherwise pattern one or more metallization layers, contacts, contact vias, or the like on In various embodiments provided herein, semiconductor processing apparatuses and methods facilitate reduction or elimination of overlay errors between a pattern formed on a first side of a semiconductor wafer and a pattern formed on a second side of the semiconductor wafer. In some embodiments, systems and methods are provided in which overlay errors resulting from the lenses of EUV lithography tools, which generally have a specific lens fingerprint with directionality which may result, for example, in an overlay offset or shift. By reducing the overlay errors between the patterns formed on the front side and on the back side of the semiconductor wafer, patterned features or structures on the front side are better aligned with those on the back side of the semiconductor wafer, which produces semiconductor device structures having improved performance and which reduces mitigation measures which otherwise may be desirable in the case of misalignment between the features or structures on the front and back sides of the semiconductor wafer.

According to one embodiment, a method is provided that includes patterning, by a first reticle, a first layer on a first side of a semiconductor wafer while the first side of the semiconductor wafer is facing a first direction. The semiconductor wafer is then flipped. A second side of the semiconductor wafer that is opposite the first side faces the first direction after the flipping the semiconductor wafer. The semiconductor wafer is then rotated about a rotational axis extending along the first direction, and a second layer on the second side of the semiconductor wafer is patterned by a second reticle.

According to another embodiment, a semiconductor processing system is provided that includes an exposure apparatus. The exposure apparatus includes a rotatable wafer stage, a reticle stage, an optics assembly between the wafer stage and the reticle stage, and a radiation source configured to emit radiation. In operation, the exposure apparatus patterns a first layer on a first side of a semiconductor wafer by reflecting the radiation to the first side of the semiconductor wafer from a first reticle that is held by the reticle stage. The semiconductor wafer is flipped on the wafer stage, and a second side of the semiconductor wafer faces the first direction after the semiconductor wafer is flipped. The semiconductor wafer is rotated by rotating the wafer stage about a rotational axis, and a second layer is patterned on the second side of the semiconductor wafer by reflecting the radiation to the first side of the semiconductor wafer from a second reticle that is held by the reticle stage.

According to yet another embodiment, a method is provided that includes patterning a first layer on a front side of a semiconductor wafer that faces a first reticle coupled to a reticle stage. The patterning the first layer includes scanning each of a plurality of exposure fields of the first layer along a scanning direction with radiation reflected by the first reticle. The semiconductor wafer is flipped, and a back side of the semiconductor wafer faces a second reticle coupled to the reticle stage after the flipping the semiconductor wafer. The semiconductor wafer is rotated about a rotational axis while the back side of the semiconductor wafer faces the second reticle. A second layer is patterned on the back side of the semiconductor wafer, which includes scanning each of a plurality of exposure fields of the second layer along the scanning direction with radiation reflected by the second reticle. The second reticle has a pattern that is a mirror-image of a pattern of the first reticle about a mirror axis that is orthogonal to the scanning direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   patterning, by a first reticle, a first layer on a first side of a semiconductor wafer while the first side of the semiconductor wafer is facing a first direction;
   flipping the semiconductor wafer, a second side that is opposite the first side of the semiconductor wafer facing the first direction after the flipping the semiconductor wafer;
   rotating the semiconductor wafer about a rotational axis extending along the first direction; and
   patterning, by a second reticle, a second layer on the second side of the semiconductor wafer,
   wherein at least one of the patterning the first layer or the patterning the second layer includes scanning the semiconductor wafer along a scanning direction by a scanner including at least one of the first reticle or the second reticle, and
   wherein the second reticle has a pattern that is a mirror-image of a pattern of the first reticle about a mirror axis that is transverse to the scanning direction.

2. The method of claim 1, wherein the mirror axis is orthogonal to the scanning direction.

3. The method of claim 1, further comprising:
   orienting an alignment indicator of the semiconductor wafer at a first position after the flipping the semiconductor wafer, the first position corresponding to a second position of the alignment indicator prior to the flipping the semiconductor wafer.

4. The method of claim 3, wherein the rotating the semiconductor wafer is performed after the orienting the alignment indicator, and the rotating the semiconductor wafer includes orienting the alignment indicator at a third position that is opposite the first and second positions along a second direction that is orthogonal to the first direction.

5. The method of claim 1, wherein the rotating the semiconductor wafer includes rotating the semiconductor wafer by rotating a wafer stage that is physically coupled to the semiconductor wafer.

6. The method of claim 1, further comprising:
   thinning the second side of the semiconductor wafer before the patterning the second layer on the second side of the semiconductor wafer.

7. The method of claim 6, wherein the thinning the second side of the semiconductor wafer includes thinning the second side of the semiconductor wafer by chemical mechanical polishing.

8. The method of claim 1, wherein the patterning the first layer on the first side of the semiconductor wafer includes projecting extreme ultraviolet light on the first layer, and the patterning the second layer on the second side of the semiconductor wafer includes projecting extreme ultraviolet light on the second layer.

9. A semiconductor processing system, comprising:
   a controller; and
   an exposure apparatus, the exposure apparatus including:
      a rotatable wafer stage;
      a reticle stage;
      an optics assembly between the wafer stage and the reticle stage; and
      a radiation source configured to emit radiation,
   wherein, in operation, the exposure apparatus is configured to:
      pattern a first layer on a first side of a semiconductor wafer by reflecting the radiation to a first side of the semiconductor wafer from a first reticle that is held by the reticle stage while the first side of the semiconductor wafer is facing a first direction;
      flip the semiconductor wafer on the wafer stage, a second side that is opposite the first side of the semiconductor wafer facing the first direction after the semiconductor wafer is flipped;
      rotate the semiconductor wafer, by rotating the wafer stage about a rotational axis; and
      pattern a second layer on the second side of the semiconductor wafer by reflecting the radiation to the second side of the semiconductor wafer from a second reticle that is held by the reticle stage, wherein the controller is configured to control the exposure apparatus to pattern the first layer on the first side of the semiconductor wafer and to pattern the second layer on the second side of the semiconductor wafer by scanning the semiconductor wafer along a scanning direction, and wherein the second reticle has a pattern that is a mirror-image of a pattern of the first reticle about a mirror axis that is orthogonal to the scanning direction.

10. The semiconductor processing system of claim 9, wherein the exposure apparatus further includes an illuminator between the radiation source and the reticle stage, the illuminator configured to receive the radiation and to direct the radiation to the reticle stage.

11. The semiconductor processing system of claim 9, wherein the controller is further configured to control the wafer stage to:

orient an alignment indicator of the semiconductor wafer at a first position after the flipping the semiconductor wafer, the first position corresponding to a second position of the alignment indicator prior to flipping the semiconductor wafer on the wafer stage; and orient the alignment indicator at a third position that is opposite the first and second positions along a direction that is orthogonal to the scanning direction.

12. The semiconductor processing system of claim 9, wherein the radiation source is an extreme ultraviolet light source.

13. The semiconductor processing system of claim 9, wherein, in operation, the semiconductor processing system is configured to thin the second side of the semiconductor wafer before the patterning the second layer on the second side of the semiconductor wafer.

14. The semiconductor processing system of claim 13, wherein the semiconductor processing system is configured to thin the second side of the semiconductor wafer by chemical mechanical polishing.

15. A method, comprising:

patterning a first layer on a front side of a semiconductor wafer that faces a first reticle coupled to a reticle stage, the patterning the first layer including scanning each of a plurality of exposure fields of the first layer along a scanning direction with radiation reflected by the first reticle;

flipping the semiconductor wafer, a back side of the semiconductor wafer facing a second reticle coupled to the reticle stage after the flipping the semiconductor wafer;

rotating the semiconductor wafer about a rotational axis while the back side of the semiconductor wafer faces the second reticle; and patterning a second layer on the back side of the semiconductor wafer, the patterning the second layer including scanning each of a plurality of exposure fields of the second layer along the scanning direction with radiation reflected by the second reticle, wherein the second reticle has a pattern that is a mirror-image of a pattern of the first reticle about a mirror axis that is orthogonal to the scanning direction.

16. The method of claim 15, further comprising:

orienting an alignment indicator of the semiconductor wafer at a first position after the flipping the semiconductor wafer, the first position corresponding to a second position of the alignment indicator prior to the flipping the semiconductor wafer.

17. The method of claim 16, wherein the rotating the semiconductor wafer is performed after the orienting the alignment indicator, and the rotating the semiconductor wafer includes orienting the alignment indicator at a third position that is opposite the first and second positions along the mirror axis.

18. The method of claim 15, wherein the rotating the semiconductor wafer includes rotating the semiconductor wafer by rotating a wafer stage that is physically coupled to the semiconductor wafer.

19. The method of claim 15, further comprising:

thinning the back side of the semiconductor wafer before the patterning the second layer on the back side of the semiconductor wafer.

20. The method of claim 19, wherein the thinning the back side of the semiconductor wafer includes thinning the back side of the semiconductor wafer by chemical mechanical polishing.

* * * * *